United States Patent
Park et al.

(10) Patent No.: US 6,852,136 B2
(45) Date of Patent: Feb. 8, 2005

(54) METHOD FOR MANUFACTURING TANTALUM OXY NITRIDE CAPACITORS

(75) Inventors: Dong-su Park, Kyunggi-do (KR); Kwang-seok Jeon, Kyunggi-do (KR)

(73) Assignee: Hynix Semiconductor Inc., Gyunggi-do (KR)

(*) Notice: Subject to any disclaimer, the term of this patent is extended or adjusted under 35 U.S.C. 154(b) by 242 days.

(21) Appl. No.: 10/021,322

(22) Filed: Dec. 12, 2001

(65) Prior Publication Data

US 2002/0095756 A1 Jul. 25, 2002

(30) Foreign Application Priority Data

Dec. 22, 2000 (KR) .................................... 2000-0080483

(51) Int. Cl.$^7$ ................................................. H01G 9/00
(52) U.S. Cl. ....................... 29/25.03; 29/25.42; 261/6; 438/396
(58) Field of Search .............................. 29/25.01, 25.02, 29/25.03, 25.42, 25.12; 216/6, 79, 99; 257/301; 438/245, 253, 381, 396, 243

(56) References Cited

U.S. PATENT DOCUMENTS

| | | | |
|---|---|---|---|
| 5,248,629 A | * | 9/1993 | Muroyama .................. 438/396 |
| 5,631,188 A | | 5/1997 | Chang et al. |
| 5,707,599 A | * | 1/1998 | Northway ............... 423/594.17 |
| 6,156,608 A | | 12/2000 | Chen |
| 6,287,910 B2 | * | 9/2001 | Lee et al. .................... 438/240 |
| 6,337,289 B1 | * | 1/2002 | Narwankar et al. ......... 438/776 |
| 6,340,622 B1 | * | 1/2002 | Lee et al. .................... 438/396 |

FOREIGN PATENT DOCUMENTS

JP    2002-319521    * 10/2002

* cited by examiner

Primary Examiner—A. Dexter Tugbang
Assistant Examiner—Donghai D. Nguyen
(74) Attorney, Agent, or Firm—Marshall, Gerstein & Borun LLP

(57) ABSTRACT

A method for manufacturing a capacitor using a tantalum oxy nitride (TaON) film in a process for a semiconductor device. More particularly, a method for manufacturing a capacitor which reduces a number of steps and thus increases yield by in-situ performing P-doping after forming a MPS (Metastable Poly Silicon) on a lower electrode and forming a nitride film before forming a tantalum oxy nitride film to prevent the concentration of phosphor contained in the lower electrode from being reduced by removing the phosphor on the surface of the lower electrode in a cleaning process between the above two steps, for thereby increasing the capacitance of the capacitor.

5 Claims, 2 Drawing Sheets

METHOD FOR MANUFACTURING TANTALUM OXY NITRIDE CAPACITORS

BACKGROUND

Technical Field

A method for manufacturing a capacitor with a tantalum oxy nitride (TaON) film for a semiconductor device is disclosed. More particularly, a method for manufacturing a capacitor is disclosed with a reduced number of steps and thus an increased yield by in-situ performing the step of executing P-doping after forming a MPS (Metastable Poly Silicon) on a lower electrode and the step of forming a nitride film before forming a tantalum oxy nitride film. The disclosed method prevents the concentration of phosphor contained in the lower electrode from being reduced by removing the phosphor on the surface of the lower electrode in a cleaning process performed between the above two steps, thereby increasing the capacitance of the capacitor.

DESCRIPTION OF THE RELATED ART

Generally, a capacitor stores a charge required for the operation of a semiconductor. As the semiconductor device is highly integrated, the size of a cell decreases, while the capacitance required for the operation of the device slightly increases. Presently, the capacitance required for devices of more than 64M DRAM is more than 30 fF per cell.

In this way, with the high integration of the semiconductor device, the miniaturization of the capacitor is also being required. However, there is a limit to the size needed for storing charge for satisfying a required capacitance. Thus, there occurs a difficulty in miniaturizing the capacitor.

In consideration of this difficulty, the structure for storing charge of the capacitor is changed in various ways. The method for increasing charge of the capacitor includes the method for using tantalum oxy nitride (TaON), BST, etc. with a large dielectric constant as dielectric, the method for reducing the thickness of a dielectric material and the method for increasing the surface area of the capacitor.

Among them, the conventional process for forming a capacitor by using tantalum oxy nitride with a large dielectric constant will now be described.

First, a lower electrode 100 is formed by using material selected from undoped silicon, low doping silicon or doped/undoped silicon capable of MPS growth (the step of forming a lower electrode), then wet etching or dry etching is performed on the formed lower electrode, then MPS is formed by using gas containing a silicon source (the step of forming MPS), and then P-Doping is performed by using a mixture of gases containing P (the step of doping MPS).

Next, a cleaning process is performed by using HF, BOE, sulfuric acid, SC-1, etc. in order to remove a native oxide film, a nitride film is formed on the resulting material of the above process, and then Si of the lower electrode is reacted with N of the formed nitride film 102, for thereby forming a Si—N bond of 5–20 Å on the surface of the lower electrode (the step of preprocessing tantalum oxy nitride.

After performing a preprocessing of tantalum oxy nitride, an amorphous thin film 104 is deposited by using chemical vapor containing tantalum by means of a surface chemical reaction occurring on a wafer resulting in a forming of a tantalum oxy nitride thin film.

Then, by nitrating or nitrifying the surface of the resultant material by plasma, structural defects such as micro cracks and pin holes on an interface can be reinforced and homogeneity can be improved. Afterwards, by forming an upper electrode 106 by stacking a metal layer, a capacitor using tantalum oxy nitride can be formed.

In the conventional process for forming a capacitor, preprocessing of tantalum oxy nitride is performed in the condition that plasma is excited in order to increase the effect of a Si—N bond. Due to the increase in temperature caused by the plasma, a problem occurs in that a tantalum oxy nitride film deposited by the low pressure chemical vapor deposition (LPCVD) is deposited non-uniformly in the wafer and thus it is difficult to meet process requirements. Particularly, it is necessary that the tantalum oxy nitride film be deposited at a low temperature of below 450° C., so the problem caused by the increase in temperature may become more serious.

In addition, in the cleaning process between the MPS doping step and the nitride film processing step of the process for preprocessing tantalum oxy nitride, the concentration of phosphor contained in the lower electrode may be reduced by removing highly doped phosphor by the MPS doping, which may lead to depletion and thus reduce the capacitance of the capacitor.

SUMMARY OF THE DISCLOSURE

Therefore, a method for manufacturing a tantalum oxy nitride capacitor is disclosed which reduces a number of steps and increases yield by performing the step of doping a MPS (Metastable Poly Silicon) in the same chamber in-situ with the forming of a nitride film before the forming of a tantalum oxy nitride film. The disclosed method prevents the concentration of phosphor contained in the lower electrode from being reduced by removing the phosphor on the surface of the lower electrode in a cleaning process performed between the above two steps, thereby increasing the capacitance of the capacitor.

In an embodiment, a method for manufacturing a tantalum oxy nitride capacitor comprises: forming a lower electrode on the surface of a semiconductor substrate by using undoped silicon, low doped silicon or doped/undoped silicon; forming MPS (Metastable Poly Silicon) by using gases each containing a silicon source after performing wet etching or dry etching of the formed lower electrode; performing MPS doping by using mixed gas containing P; depositing a nitride film, in the same chamber of the MPS doping process as a tantalum oxy nitride preprocessing step; depositing a tantalum oxy nitride thin film by using chemical vapor containing tantalum on the nitride film; performing a tantalum oxy nitride postprocessing by nitrating or nitrifying the surface of the thin film after the above depositing process; and forming an upper electrode by stacking a metal layer on the upper portion of the above resultant material.

Also, where previously an MPS growing chamber, an MPS doping chamber, and a tantalum oxy nitride chamber were separately required, the above processes from the MPS formation step to the tantalum oxy nitride thin film depositing step can be performed in the same chamber or system. The above four processes such as MPS formation, the MPS doping, the nitride depositing and the tantalum oxy nitride film depositing are performed in the same system or chamber.

In a method for manufacturing a capacitor according to the disclosure, since the MPS doping step and a nitride film depositing step before the tantalum oxy nitride film formation are performed in the same chamber, a cleaning process for removing a native oxide is unnecessary, thereby preventing the phenomenon decreasing capacitance of the capacitor and a bridge between cells caused by crushing of MPS particles.

In a method for manufacturing a capacitor according to the disclosure, since the MPS doping step and a nitride film depositing step before the tantalum oxy nitride film formation are performed at the same chamber, a problem where a tantalum oxy nitride film is deposited non-uniformly due to the increase in temperature caused by the excited plasma is avoided.

In a method for manufacturing a capacitor according to the disclosure as above, the etching to the lower electrode can be performed by using gas contained HF, especially, the mixed gas such as hydrogen fluoride/water (HF/$H_2O$), hydrogen fluoride/hydrogen peroxide (HF/$H_2O_2$), buffered oxide etchant (BOE), hydrogen fluoride/acetic acid/nitrogen dioxide (HF/$CH_3COOH$/$NO_2$) etc. and mixture thereof.

In the MPS formation step, a gas containing a silicon source can be selected from the group consisting of $SiH_4$, $Si_2H_6$, $SiH_2Cl_2$, mixtures thereof and performed at a pressure below about 5×10–4 torr below and a temperature below about 700° C. (on the basis of temperature of wafer).

The MPS doping step can be performed under a pressure ranging from about $1 \times 10^{-3}$ to about 500 torr and at a temperature ranging from about 500 to about 1000° C., the gas containing P can be used a mixed gas containing $PH_3$ and the mixed gas containing $PH_3$ can be selected from the group consisting of $PH_3$/$N_2$, $PH_3$/$H_2$, $PH_3$/$SiH_4$ and $PH_3$/Ar.

Also, preferably, the nitride depositing step is performed by using $NH_3$ gas and under a pressure ranging from about of 0.1 to about 200 torr and at a temperature ranging from about 600 to about 850° C.

In the tantalum oxy nitride film depositing, a tantalum compound such as tantalum ethylate is supplied to an evaporator or evaporating tube through a flow rate controller such as a MFC (mass flow controller), and then a predetermined amount thereof is evaporated at a temperature ranging from about 150 to about 200° C. for thereby obtaining a chemical vapor of tantalum components. The chemical vapor and reaction gas, i.e., excessive $O_2$ gas and $NH_3$ gas obtained by the above method, each are controlled to a flow rate ranging from about 10 to about 1000 sccm, are supplied and then are surface-reacted in a LPCVD chamber at a temperature ranging from about 300 to about 600° C., for thereby obtaining an amorphous tantalum oxy nitride thin film.

Also, the tantalum oxy nitride postprocessing step can be, performed by nitrating the surface under $NH_3$ (or $N_2$/$H_2$, $N_2O$, $O_2$) atmosphere at a temperature ranging from about 200 to about 600° C. by using plasma or nitrifying the same under $N_2O$ (or $O_2$) atmosphere. By performing the postprocessing step as above, structural defects such as a micro crack and a pin hole on an interface can be reinforced and homogeneity can be improved. Although the characteristic of the tantalum oxy nitride is improved by this method, a process is added and therefore this step can be omitted if the electrical characteristic needed to a product is obtained in the high temperature heat treatment of the next step. Particularly, after depositing an amorphous tantalum oxy nitride thin film, in case of using a RTP (rapid thermal process) or an electric furnace, crystallization can be induced by a process for nitrating or oxidizing the resultant material for a time period ranging from about 30 seconds to about 120 minutes at a temperature ranging from about 650 to about 950° C. under a $NH_3$ (or $N_2$/$H_2$, $N_2O$, $O_2$) atmosphere.

In addition, in a step for forming an upper electrode, the upper electrode is formed by depositing the metal selected from the group consisting of poly silicon (Poly Si), titanium nitride (TiN), tantalum nitride (TaN), tungsten (W), tungsten nitride (WN), tungsten silicide (Wsi), ruthenium (RU), ruthenium oxide ($RuO_2$), iridium (Ir), platinum (Pt), etc. individually or in a stacking structure.

BRIEF DESCRIPTION OF THE DRAWINGS

The above features and advantages of the disclosure will become more apparent from the following detailed description taken in conjunction with the accompanying drawings, wherein:

FIGS. 1 through 5 illustrate the sequence of processes for manufacturing a tantalum oxy nitride capacitor in accordance with the prior art as well as this disclosure, in which:

FIG. 1 illustrates a resultant material obtained after forming a lower electrode and forming MPS (not shown) on the upper portion thereof;

FIG. 2 illustrates a resultant material obtained after performing MPS doping on the resultant material of FIG. 1;

FIG. 3 illustrates a resultant material obtained after performing a step of depositing a nitride film as a step of preprocessing tantalum oxy nitride;

FIG. 4 illustrates a resultant material obtained after depositing a tantalum oxy-nitride thin film on the upper portion of the resultant material of FIG. 3; and FIG. 5 illustrates a tantalum oxy nitride capacitor completed by forming an upper electrode on the upper portion of the resultant material of FIG. 4.

DETAILED DESCRIPTION OF THE PRESENTLY PREFERRED EMBODIMENT

FIGS. 1 through 5 are views illustrating the disclosed sequence of processes for manufacturing a tantalum oxy nitride capacitor.

Figure 1:
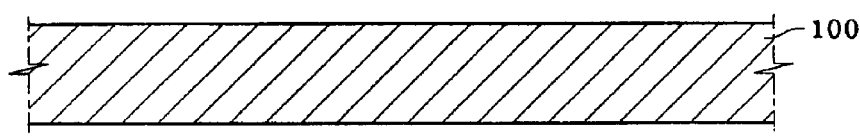

In process accord to the disclosure, as illustrated in FIG. 1, a lower electrode 100 is formed on the surface of a semiconductor substrate 40 (not shown). At this time, the lower electrode is selected from undoped silicon, low doping silicon or doped/undoped silicon which are capable of MPS growth. At this time, a thin film used as the electrode is an amorphous silicon film deposited at a temperature of below about 560° C. by using a gas containing a silicon source such as $SiH_4$, $Si_2H_6$, $SiH_2Cl_2$ and the like and a gas containing $PH_3$ such as $PH_3$/$N_2$, $PH_3$/$SiH_4$, $PH_3$/Ar and the like. At this time, conditions such as an amount of gas, pressure, etc. can be made suitable for a selective polycrystalline silicon growing technique (MPS growing technique).

Next, the thusly formed lower electrode is wet/dry etched by using a mixture of gases such as HF/$H_2O$, HF/$H_2O_2$, BOE, HF/$CH_3COOH$/$NO_2$, etc., and it is stored in a space keeping a constant pressure below about 1×10–2 torr while MPS is formed on the upper portion of the resultant material by using $SiH_4$, $Si_2H_6$ and $SiH_2Cl_2$ each containing a silicon source under a pressure of below about $5 \times 10^{-4}$ torr (the MPS formation step). But, the formed MPS has no relation with the characteristics of the present invention, so it is not shown in the drawings.

Figure 2:
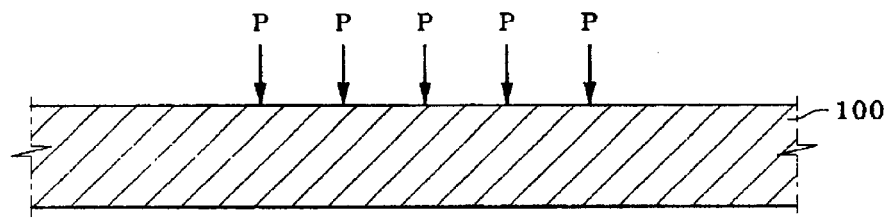

After the above process, P-doping is performed by using gas such as $PH_3$/$N_2$, $PH_3$/$H_2$, $PH_3$/$SiH_4$, $PH_3$/Ar each containing $PH_3$ under a pressure ranging from about $1 \times 10^{-3}$ to about 500 torr and at a temperature ranging from about 500 to about 1000° C. (the MPS doping step). FIG. 2 is a view illustrating a lower electrode onto which MPS doping is performed.

Figure 3:
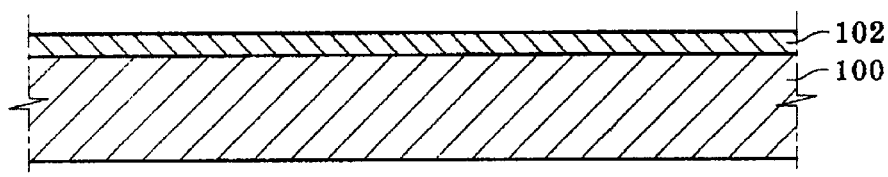

Then, in the same chamber ("in-situ"), a nitride film 102 is formed by using $NH_3$ gas under a pressure ranging from about 0.1 to about 200 torr and at a temperature ranging from about 600 to about 850° C. By this, the $NH_3$ is reacted with Si of the lower electrode, for thereby forming a silicon-nitrogen (Si—N) bond on the surface of the lower electrode to a thickness ranging from about 5 to about 20 Å as illustrated in FIG. 3 (the tantalum oxy nitride preprocessing step).

Figure 4:
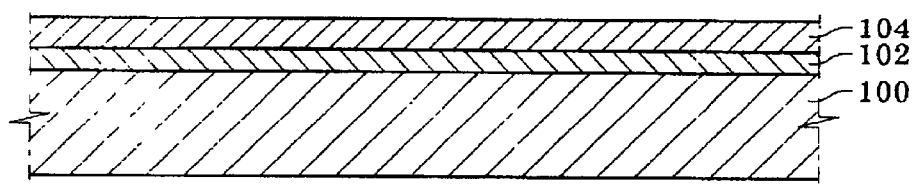

After performing the tantalum oxy nitride preprocessing step, a tantalum compound such as tantalum ethylate is supplied to an evaporator or evaporating tube through a flow rate controller such as a MFC (mass flow controller), and then a predetermined amount thereof is evaporated at a temperature ranging from about 150 to about 200° C. for thereby obtaining a chemical vapor of tantalum components. The chemical vapor and reaction gas, i.e., excessive $O_2$ gas and $NH_3$ gas, each are controlled to a flow rate ranging from about 10 to about 1000 sccm, are supplied and then are surface-reacted in a LPCVD chamber at a temperature ranging from about 300 to about 600° C., for thereby obtaining an amorphous tantalum oxy nitride thin film 104 as illustrated in FIG. 4 (the tantalum oxy nitride thin film formation step).

Afterwards, by nitrating the surface under $NH_3$' (or $N_2/H_2$) atmosphere at a temperature ranging from about 200 to about 600° C. by using plasma or nitrifying the same under $N_2O$ (or $O_2$) atmosphere in in-situ or ex-situ, structural defects such as a micro cracks and pin holes on an interface can be reinforced and homogeneity can be improved. Particularly, after depositing an amorphous tantalum oxy nitride thin film, in case of using a RTP (rapid thermal process) or an electric furnace, crystallization can be induced by a process for nitrating or oxidizing the resultant material for a time period ranging from about 30 seconds to about 120 minutes at a temperature ranging from about 650 to about 950° C. under $NH_3$ (or $N_2/H_2$, $N_2O$, $O_2$) atmosphere (the tantalum oxy nitride postprocessing step).

Figure 5:
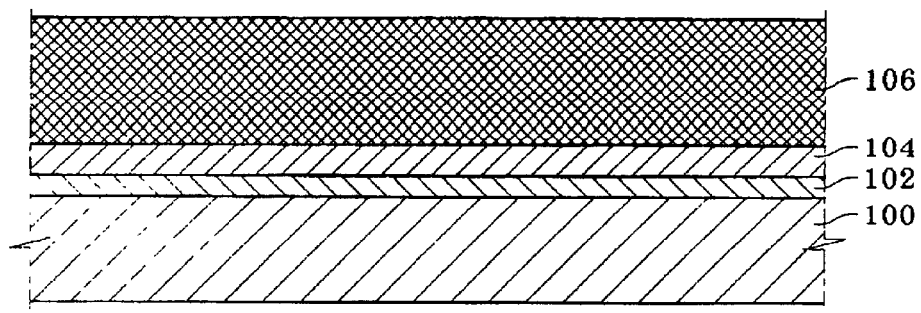

After performing the postprocessing step, as illustrated in FIG. 5, an upper electrode 106 is formed for thereby completing a capacitor according to the present invention. As described above, the upper electrode can be formed by depositing poly silicon (Poly Si), titanium nitride (TiN), tantalum nitride (TaN), tungsten (W), tungsten nitride (WN), tungsten silicide (Wsi), ruthenium (RU), ruthenium oxide ($RuO_2$), iridium (Ir), platinum (Pt), etc. individually or in a stacking structure (the upper electrode formation step).

As seen from above, in the method for forming a tantalum oxy nitride capacitor, since the MPS doping step and the tantalum oxy nitride preprocessing step are performed in the same chamber (in-situ), depletion occurred due to the decrease in the concentration of P on the surface of the lower electrode caused by cleaning can be prevented. Thus, the capacitance of the capacitor can, be increased, the crushing of MPS particles caused by cleaning can be prevented, and thus a bridge between cells by the MPS particles is blocked, for thereby reducing bit fail of the device.

In addition, the MPS formation step through the tantalum oxy nitride thin film formation step can be performed in-situ in the same system. Accordingly, equipment investment and process time can be reduced for thereby improving the productivity of the process.

What is claimed is:

1. A method for manufacturing a tantalum oxy nitride capacitor comprising:

forming a lower electrode on a surface of a semiconductor substrate using a material selected from the group consisting of undoped silicon, doped silicon and mixtures thereof;

forming MPS (Metastable Poly Silicon) using gases each containing a silicon source after performing wet etching or dry etching of the lower electrode;

performing a MPS doping in a chamber by using a mixed gas comprising phosphor (P);

depositing a nitride film, in said chamber, depositing a tantalum oxy nitride thin film using a chemical vapor comprising tantalum on the nitride film;

performing a nitrating or nitrifying of a surface of the tantalum oxy nitride thin film; and forming an upper electrode by stacking a metal layer on an upper portion of the tantalum oxy nitride thin film, wherein a gas comprising a silicon source is used in the forming of the MPS and said gas selected from the group consisting of $SiH_4$, $Si_2H_6$, $SiH_2Cl_2$ and mixtures thereof.

2. A method for manufacturing a tantalum oxy nitride capacitor comprising:

forming a lower electrode on a surface of a semiconductor substrate using a material selected from the group consisting of undoped silicon, doped silicon and mixtures thereof;

forming MPS (Metastable Poly Silicon) using gases each containing a silicon source after performing wet etching or dry etching of the lower electrode;

performing a MPS doping in a chamber by using a mixed gas comprising phosphor (P);

depositing a nitride film, in said chamber;

depositing a tantalum oxy nitride thin film using a chemical vapor comprising tantalum on the nitride film;

performing a nitrating or nitrifying of a surface of the tantalum oxy nitride thin film; and forming an upper electrode by stacking a metal layer on an upper portion of the tantalum oxy nitride thin film, wherein the MPS doping is performed under a pressure ranging from about $10 \times 10^{-3}$ torr to about 500 torr and at a temperature ranging from about 500° C. to about 1000° C.

3. A method for manufacturing a tantalum oxy nitride capacitor comprising:

forming a lower electrode on a surface of a semiconductor substrate using a material selected from the group consisting of undoped silicon, doped silicon and mixtures thereof;

forming MPS (Metastable Poly Silicon) using gases each containing a silicon source after performing wet etching or dry etching of the lower electrode;

performing a MPS doping in a chamber by using a mixed gas comprising phosphor (P);

depositing a nitride film, in said chamber;

depositing a tantalum oxy nitride thin film using a chemical vapor comprising tantalum on the nitride film;

performing a nitrating or nitrifying of a surface of the tantalum oxy nitride thin film; and forming an upper electrode by stacking a metal layer on an upper portion of the tantalum oxy nitride thin film, wherein the mixed gas comprising phosphor (P) is a mixed gas comprising $PH_3$.

4. A method for manufacturing a tantalum oxy nitride capacitor comprising:

forming a lower electrode on a surface of a semiconductor substrate using a material selected from the group consisting of undoped silicon, doped silicon and mixtures thereof;

forming MPS (Metastable Poly Silicon) using gases each containing a silicon source after performing wet etching or dry etching of the lower electrode;

performing a MPS doping in a chamber by using a mixed gas comprising phosphor (P);

depositing a nitride film, in said chamber;

depositing a tantalum oxy nitride thin film using a chemical vapor comprising tantalum on the nitride film;

performing a nitrating or nitrifying of a surface of the tantalum oxy nitride thin film; and forming an upper electrode by stacking a metal layer on an upper portion of the tantalum oxy nitride thin film, wherein the mixed gas comprising phosphor (P) is selected from the group consisting of $PH_3/N_2$, $PH_3/H_2$, $PH_3/SiH_4$, $PH_3/Ar$ and mixtures thereof.

5. A method for manufacturing a tantalum oxy nitride capacitor comprising:

forming a lower electrode on a surface of a semiconductor substrate using a material selected from the group consisting of undoped silicon, doped silicon and mixtures thereof;

forming MPS (Metastable Poly Silicon) using gases each containing a silicon source after performing wet etching or dry etching of the lower electrode;

performing a MPS doping in a chamber by using a mixed gas comprising phosphor (P);

depositing a nitride film, in said chamber;

depositing a tantalum oxy nitride thin film using a chemical vapor comprising tantalum on the nitride film;

performing a nitrating or nitrifying of a surface of the tantalum oxy nitride thin film; and forming an upper electrode by stacking a metal layer on an upper portion of the tantalum oxy nitride thin film, wherein the nitride depositing is performed by using ammonia ($NH_3$) gas and wherein the nitride depositing is performed under a pressure ranging from about 0.1 torr to about 200 torr and at a temperature ranging from about 600° C. to about 850° C.

* * * * *

UNITED STATES PATENT AND TRADEMARK OFFICE
CERTIFICATE OF CORRECTION

PATENT NO. : 6,852,136 B2
DATED : February 8, 2005
INVENTOR(S) : Dong-Su Park et al.

It is certified that error appears in the above-identified patent and that said Letters Patent is hereby corrected as shown below:

Column 6,
Line 6, after "depositing a nitride film, in said" please delete "chamber, depositing" and insert -- chamber; depositing -- in its place.
Line 38, after "ranging from about" please delete "$10 \times 10^{-3}$" and insert -- $1.0 \times 10^{-3}$ -- in its place.

Signed and Sealed this

Twenty-fourth Day of May, 2005

JON W. DUDAS
*Director of the United States Patent and Trademark Office*